(12) United States Patent
Tu et al.

(10) Patent No.: US 8,928,104 B2
(45) Date of Patent: Jan. 6, 2015

(54) IMAGE SENSOR PACKAGING STRUCTURE WITH BLACK ENCAPSULANT

(75) Inventors: Hsiu-Wen Tu, Hsin-Chu Hsien (TW); Chung-Hsien Hsin, Hsin-Chu Hsien (TW); Chun-Hua Chuang, Hsin-Chu Hsien (TW); Ren-Long Kuo, Hsin-Chu Hsien (TW); Chin-Fu Lin, Hsin-Chu Hsien (TW); Young-Houng Shiao, Hsin-Chu Hsien (TW)

(73) Assignee: Kingpak Technology Inc., Hsin-chu Hsien (TW)

(*) Notice: Subject to any disclaimer, the term of this patent is extended or adjusted under 35 U.S.C. 154(b) by 261 days.

(21) Appl. No.: 12/947,970

(22) Filed: Nov. 17, 2010

(65) Prior Publication Data
US 2011/0156188 A1 Jun. 30, 2011

(30) Foreign Application Priority Data
Dec. 31, 2009 (TW) .............................. 98146151 A

(51) Int. Cl.
*H01L 31/0203* (2014.01)
*H01L 27/146* (2006.01)
*H01L 23/00* (2006.01)

(52) U.S. Cl.
CPC .... *H01L 27/14618* (2013.01); *H01L 27/14623* (2013.01); *H01L 27/14625* (2013.01); *H01L 27/14683* (2013.01); *H01L 24/97* (2013.01); *H01L 2224/48479* (2013.01); *H01L 2224/73265* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48227* (2013.01); *H01L 2224/48471* (2013.01); *H01L 2224/49175* (2013.01); *H01L 2924/00014* (2013.01); *H01L 2924/15311* (2013.01); *H01L 2924/16235* (2013.01); *H01L 2924/1815* (2013.01); *H01L 2224/97* (2013.01)
USPC .......................................... 257/434; 257/433

(58) Field of Classification Search
CPC ...... H01L 33/54; H01L 33/48; H01L 31/0203
USPC ........................................ 257/433, 432, 434
See application file for complete search history.

(56) References Cited

U.S. PATENT DOCUMENTS

| | | | | |
|---|---|---|---|---|
| 6,972,497 B2 * | 12/2005 | Prior | | 257/788 |
| 7,312,106 B2 * | 12/2007 | Raben | | 438/112 |
| 2006/0043515 A1 * | 3/2006 | Ford | | 257/436 |
| 2008/0237766 A1 * | 10/2008 | Kim | | 257/432 |
| 2009/0206431 A1 * | 8/2009 | Bolken et al. | | 257/432 |
| 2011/0156188 A1 * | 6/2011 | Tu et al. | | 257/432 |

FOREIGN PATENT DOCUMENTS

EP 2026382 A1 * 2/2009

* cited by examiner

*Primary Examiner* — Yu-Hsi D Sun
(74) *Attorney, Agent, or Firm* — Juan Carlos A. Marquez; Bacon & Thomas PLLC

(57) ABSTRACT

An image sensor packaging structure with a low transmittance encapsulant is provided. The image sensor packaging structure includes a substrate, a chip, a transparent lid, and the low transmittance encapsulant. The chip is combined with the substrate. The transparent lid is adhered to the chip and cover above a sensitization area of the chip to form an air cavity. The low transmittance encapsulant is formed on the substrate and encapsulates the chip and the transparent lid so as to accomplish the package of the image sensor packaging structure. Due to the feature of prohibiting from light passing through the low transmittance encapsulant, the arrangement of the low transmittance encapsulant can avoid the light from outside interfere the image sensing effect of the image sensor. Therefore, the quality of the image sensing can be ensured.

12 Claims, 10 Drawing Sheets

IMAGE SENSOR PACKAGING STRUCTURE WITH BLACK ENCAPSULANT

BACKGROUND OF THE INVENTION

1. Field of the Invention

The present invention relates to image sensor packaging structures with low transmittance encapsulants, and more particularly, to an image sensor packaging structure for use in improving the image sensing quality.

2. Description of the Prior Art

The advent and prevalence of various digital video products are followed by ever-increasing demand for image sensors for use with digital video products, such as digital still cameras, cell phone cameras, and video phones. Image sensors work by converting received optical signals into electrical signals and then analyzing the electrical signals by an external device. Hence, image sensors can be integrated into electronic products to perform related imaging functions, such as taking pictures and shooting videos.

FIG. 1A is a disassembled schematic view of a conventional image sensor packaging structure 10. FIG. 1B is an assembled schematic view of FIG. 1A.

Referring to FIG. 1A, the conventional image sensor packaging structure 10 includes: an image sensor chip 12; and a lens assembly 13 provided above the image sensor chip 12. The lens assembly 13 enables light rays to focus on the image sensor chip 12 and thereby enhances image sensing quality.

Referring to FIG. 1A and FIG. 1B, to prevent the light rays from entering the image sensor packaging structure 10 sideways to thereby cause multipath refraction, multipath reflection, and multipath scattering of the light rays inside the image sensor packaging structure 10 to the detriment of image sensing quality, the lens assembly 13 is enclosed by a housing 14 for blocking ambient light, which therefore maintains the image sensing performance of the image sensor packaging structure 10.

Although the housing 14 blocks ambient light and thereby improves image sensing quality, not only does alignment of the housing 14 pose a challenge, but the housing 14 incurs costs and increases the complexity of the fabrication process of the image sensor packaging structure 10.

SUMMARY OF THE INVENTION

The present invention relates to an image sensor packaging structure with a low transmittance encapsulant for encapsulating the image sensor packaging structure, blocking ambient light, and ultimately preventing ambient light rays from entering the image sensor packaging structure sideways.

The present invention relates to an image sensor packaging structure with a low transmittance encapsulant able to withstand light penetration to thereby prevent ambient light rays from entering the image sensor packaging structure sideways, preclude multipath refraction, multipath reflection, and multipath scattering of the light rays inside the image sensor packaging structure, and ultimately ensure image sensing quality.

The present invention relates to an image sensor packaging structure with a low transmittance encapsulant which substitutes for a conventional housing so as to reduce parts and components of the image sensor packaging structure, simplify assembly of the image sensor packaging structure, and lower the material costs of the image sensor packaging structure.

To achieve the above and other objectives, the present invention provides an image sensor packaging structure with a low transmittance encapsulant, comprising: a substrate having a carrying surface and a bottom surface, the carrying surface being disposed thereon with a plurality of first conductive contacts; a chip having a first surface and a second surface and provided with a plurality of second conductive contacts, the first surface being coupled to the carrying surface, the second surface being defined with a sensitization area, and the second conductive contacts being signal-connected to the first conductive contacts; a transparent lid having a third surface and a fourth surface and disposed above the sensitization area to thereby form an air cavity; and a low transmittance encapsulant formed on the substrate to encapsulate the chip and the transparent lid.

Implementation of the present invention at least involves the following inventive steps:

1. An image sensor packaging structure is encapsulated by a low transmittance encapsulant for preventing ambient light rays from entering the image sensor packaging structure sideways and ultimately maintaining the image sensing performance and the imaging performance.

2. The low transmittance encapsulant is not penetrable by light and thus is effective in ensuring the quality of image sensing and imaging.

3. The low transmittance encapsulant substitutes for a conventional housing so as to simplify the fabrication process of the image sensor packaging structure and cut material costs of the image sensor packaging structure.

The features and advantages of present invention are described in detail hereunder to enable persons skilled in the art to understand and implement the disclosure of the present invention and readily apprehend objectives and advantages of the present invention with references made to the disclosure contained in the specification, the claims, and accompanying drawings.

DETAILED DESCRIPTION OF THE EMBODIMENTS

Figure 1A:
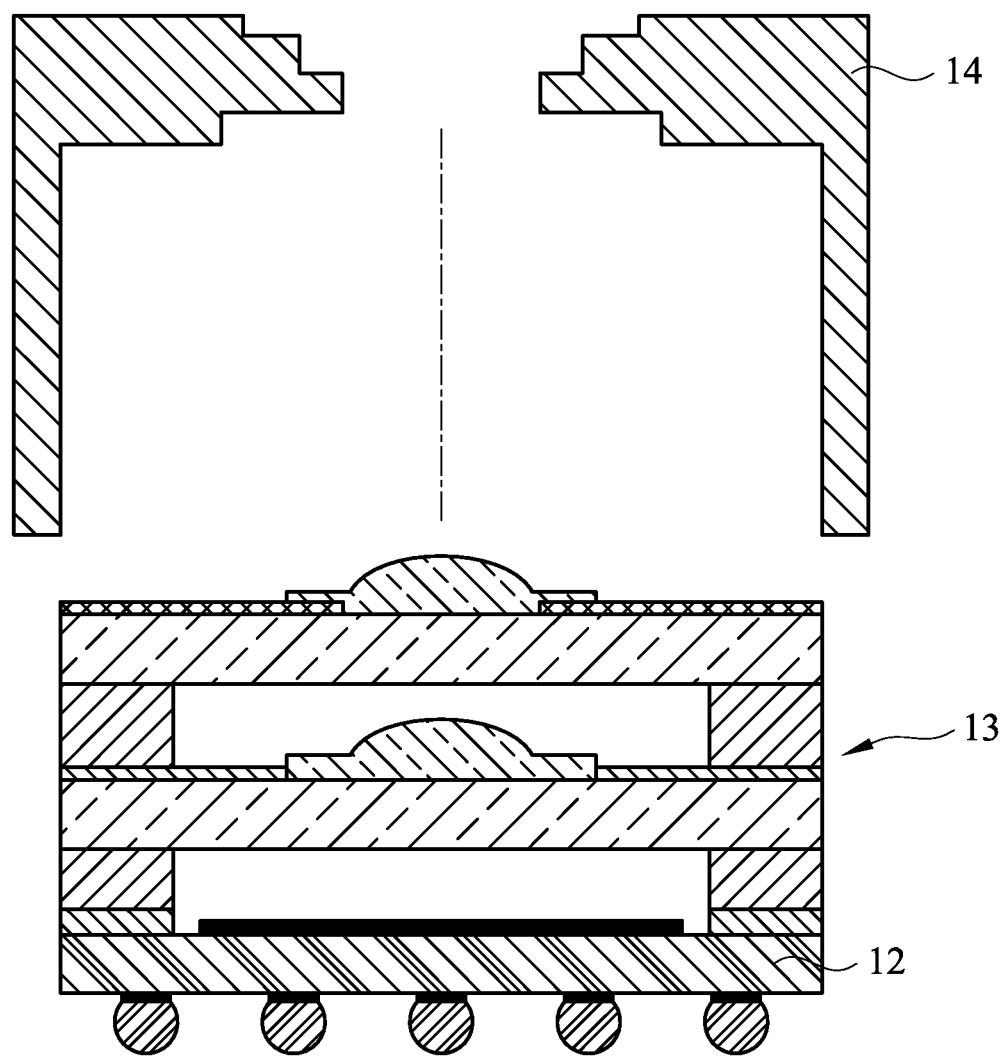
FIG. 1A is a disassembled schematic view of a conventional image sensor packaging structure.
Figure 1B:
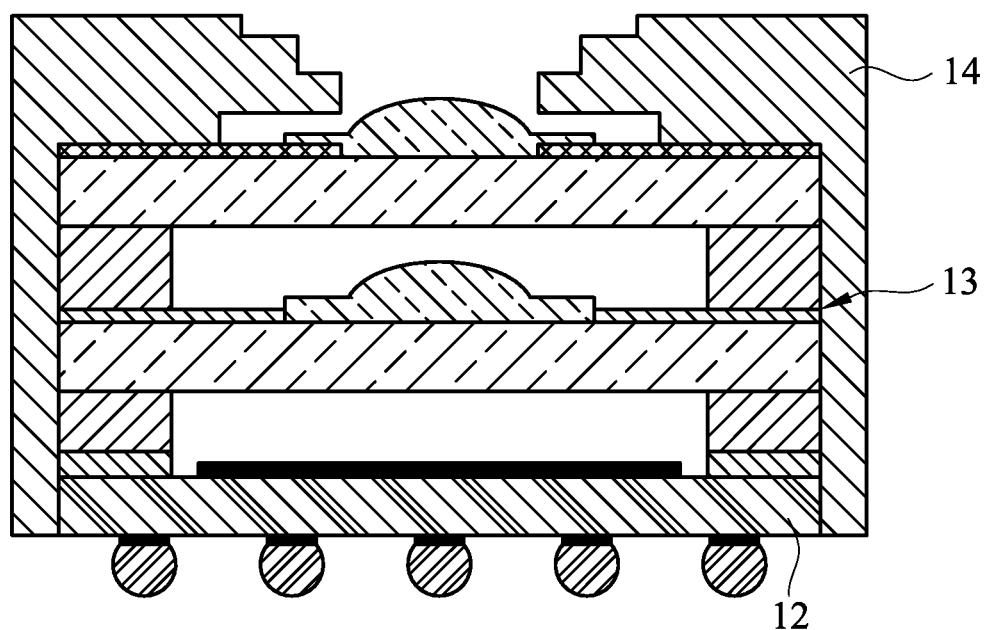
FIG. 1B is an assembled schematic view of FIG. 1A.
Figure 2A:
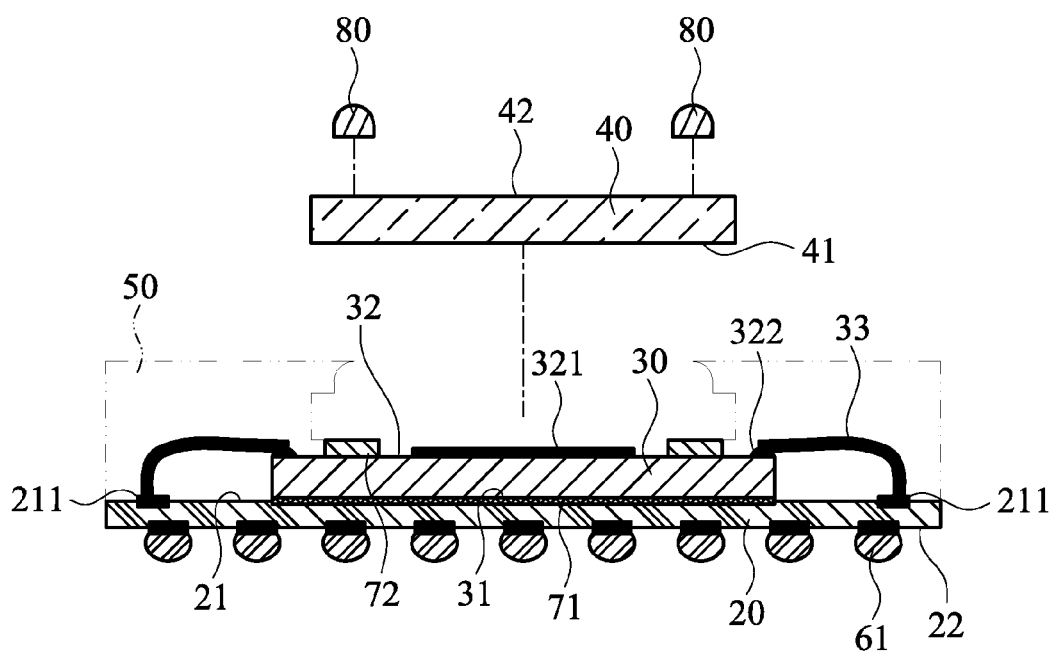
FIG. 2A is a partially disassembled cross-sectional view of an image sensor packaging structure with a low transmittance encapsulant according to the present invention.

Referring to FIG. 2A, in this embodiment, an image sensor packaging structure with a low transmittance encapsulant includes a substrate 20, a chip 30, a transparent lid 40, and a low transmittance encapsulant 50.

Referring to FIG. 2A, the substrate 20 is configured for general use with an image sensor packaging structure. For instance, the substrate 20 is a circuit board with a circuit structure. The substrate 20 has a carrying surface 21 and a bottom surface 22. The carrying surface 21 is the upper surface of the substrate 20. The bottom surface 22 is the lower surface of the substrate 20. A plurality of first conductive contacts 211 is disposed on the carrying surface 21 of the substrate 20. A plurality of solder balls 61 is implanted on the bottom surface 22 of the substrate 20.

The substrate 20 is provided with a circuit structure. The circuit structure allows the first conductive contacts 211 and the solder balls 61 to be signal-connected. Hence, the image sensor packaging structure can be further signal-connected to another external device via the solder balls 61.

The chip 30 is a complementary metal oxide semiconductor (CMOS) image sensing chip or a charge-coupled device (CCD) for receiving and sensing light. Referring to FIG. 2A, the chip 30 has a first surface 31 and a second surface 32. The first surface 31 is the lower surface of the chip 30. The second surface 32 is the upper surface of the chip 30. The first surface 31 of the chip 30 is coupled to the carrying surface 21 of the substrate 20; in other words, the chip 30 can be disposed on the carrying surface 21 of the substrate 20. The chip 30 is adhered to the carrying surface 21 of the substrate 20 by an adhesive agent 71.

Figure 3A:
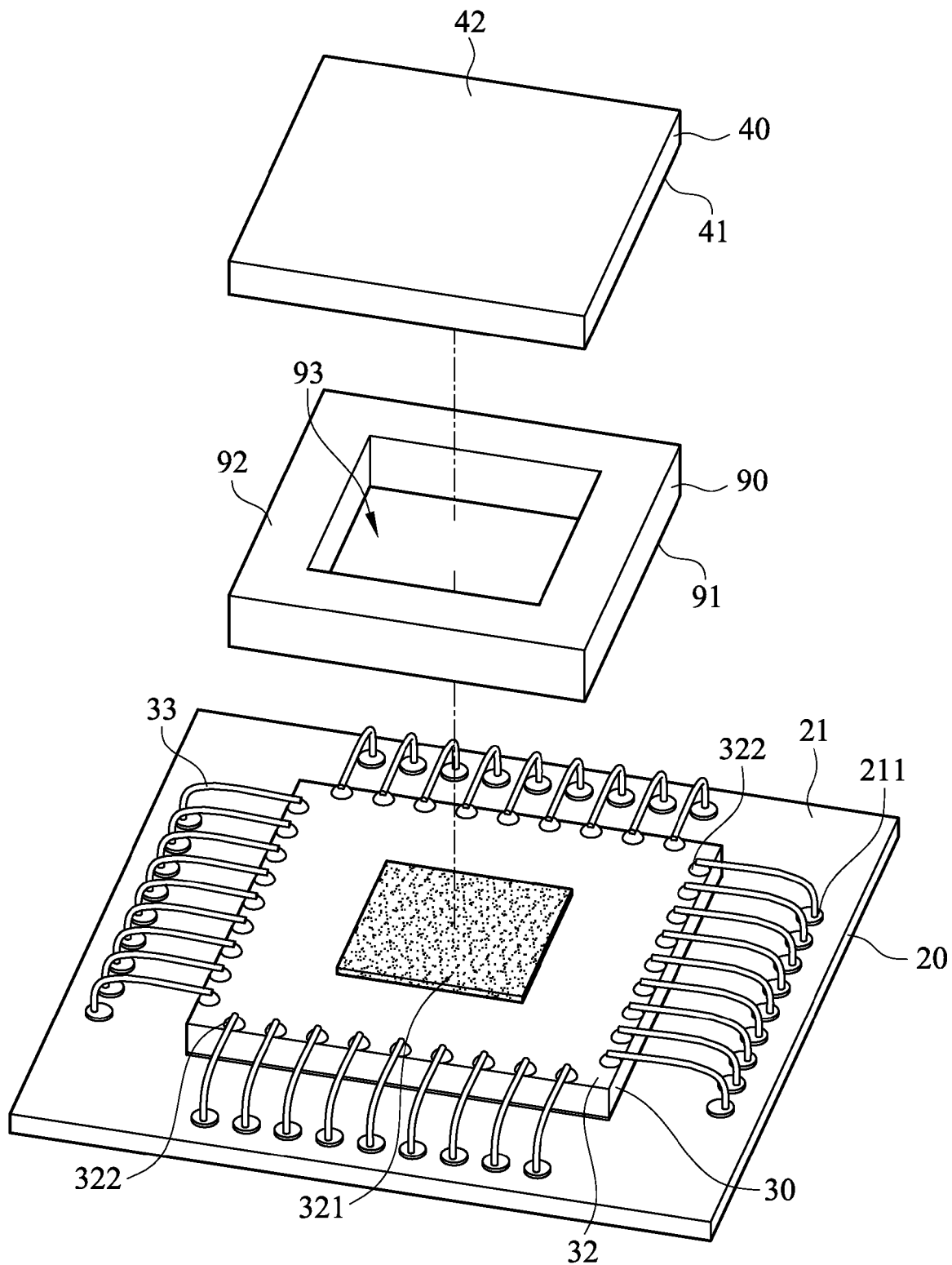
FIG. 3A is an exploded perspective view of an image sensor packaging structure in a semi-finished state according to the present invention.

Referring to FIG. 2A and FIG. 3A, the second surface 32 of the chip 30 is defined with a sensitization area 321 and provided with a plurality of second conductive contacts 322. The sensitization area 321 includes a plurality of photosensitive elements. The second conductive contacts 322 are arranged to surround the sensitization area 321 and signal-connected to the photosensitive elements. The second conductive contacts 322 on the chip 30 are signal-connected to the first conductive contacts 211 on the substrate 20 by wire bonding, that is, via a plurality of metal wires 33. As a result, the photosensitive elements are signal-connected to the solder balls 61.

Figure 3B:
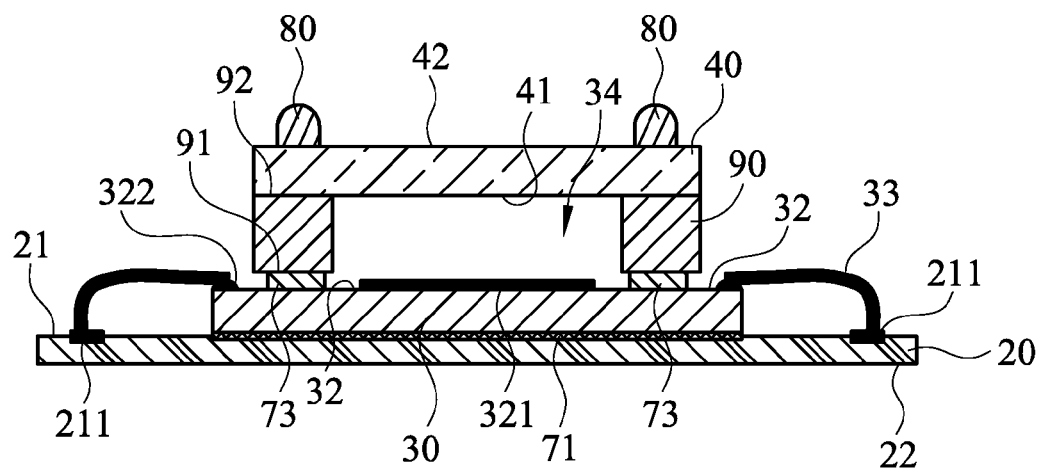
FIG. 3B is an assembled cross-sectional view of the semi-finished image sensor packaging structure shown in FIG. 3A and provided with a dam.

Referring to FIG. 2A, the transparent lid 40 is disposed above the sensitization area 321 of the chip 30 for protecting the chip 30 and preventing contaminants from contaminating the sensitization area 321 of the chip 30. Light rays penetrate the transparent lid 40 to fall on the sensitization area 321 of the chip 30. The transparent lid 40 has a third surface 41 and a fourth surface 42. The transparent lid 40 is adhered, via the third surface 41 thereof, to the second surface 32 of the chip 30 by a first adhesive layer 72. Referring to FIG. 3B, the transparent lid 40 covers the sensitization area 321 from above, thereby allowing an air cavity 34 to be formed between the transparent lid 40 and the chip 30. Referring to FIG. 2A, the first adhesive layer 72 is made of an epoxy resin. The first adhesive layer 72 is disposed between the sensitization area 321 and the second conductive contacts 322. The first adhesive layer 72 does not cover the sensitization area 321 and thereby does not jeopardize the light-sensing function of the chip 30.

Figure 2B:
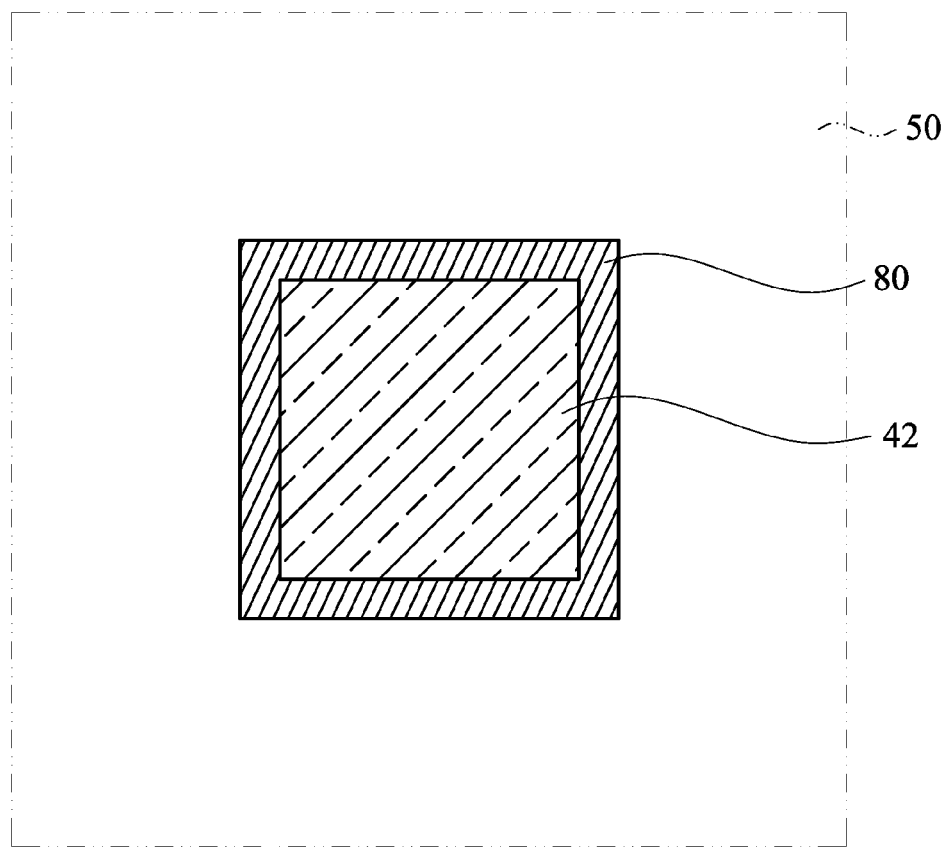
FIG. 2B is a top view of FIG. 2A.

Referring to FIG. 2A and FIG. 2B, the low transmittance encapsulant 50 is formed on the substrate 20 to encapsulate the metal wires 33, the chip 30, and the transparent lid 40. The low transmittance encapsulant 50 is formed on the substrate 20 by molding. The low transmittance encapsulant 50 is a black encapsulant and is not penetrable by light to thereby prevent ambient light rays from entering the image sensor packaging structure sideways, preclude multipath refraction, multipath reflection, and multipath scattering of the light rays inside the image sensor packaging structure, and ultimately ensure the quality of image sensing and imaging.

Forming the image sensor packaging structure by molding can greatly reduce the cycle time of the fabrication process of the image sensor packaging structure, increase throughput, enable the image sensor packaging structure to be manufactured by batch-type production, and cut process costs. However, during the molding process of the image sensor packaging structure, it is necessary to prevent the image sensor packaging structure from being damaged by the pressure directly exerted on the transparent lid 40 by a mold. To this end, at least a dam 80 is disposed on the transparent lid 40. The dam 80 functions as a baffle between the transparent lid 40 and the mold.

Referring to FIG. 2A and FIG. 2B, the dam 80 is disposed on the transparent lid 40 and, more specifically, disposed at the periphery of the fourth surface 42 of the transparent lid 40 (as shown in FIG. 2B), but does not cover the sensitization area 321 of the chip 30 (as shown in FIG. 2A). Hence, light penetrates the transparent lid 40 to fall evenly onto the sensitization area 321 of the chip 30. The dam 80 is made of an epoxy resin or a film. Forming the dam 80 on the transparent lid 40 entails disposing the epoxy resin or the film at a predetermined position and then curing or semi-curing the epoxy resin or the film by UV radiation or baking. There is therefore an appropriate resilience required for close-fitting contact between an upper die and the dam 80 during a subsequent molding process.

Afterward, the semi-finished image sensor packaging structure with the dam 80 is placed in a mold (not shown). The mold comprises an upper die and a lower die. The substrate 20 rests on the lower die when the bottom surface 22 of the substrate 20 comes into contact with the lower die. The sidewall of the upper die abuts against the carrying surface 21 of the substrate 20. The substrate 20 is held in position by the upper die and the lower die from the carrying surface 21 and the bottom surface 22 of the substrate 20, respectively. The upper surface inside the upper die is a flat even surface in contact with the top surface of the dam 80, thereby allowing a cavity to be formed between the upper die and the lower die.

The low transmittance encapsulant 50 is introduced into the cavity to encapsulate therein the metal wires 33, the chip 30, the transparent lid 40, and the dam 80. The dam 80, the transparent lid 40, and the upper die together form a baffle-like structure for blocking the low transmittance encapsulant 50 and stopping the low transmittance encapsulant 50 from spilling onto the fourth surface 42 of the transparent lid 40.

Figure 3C:
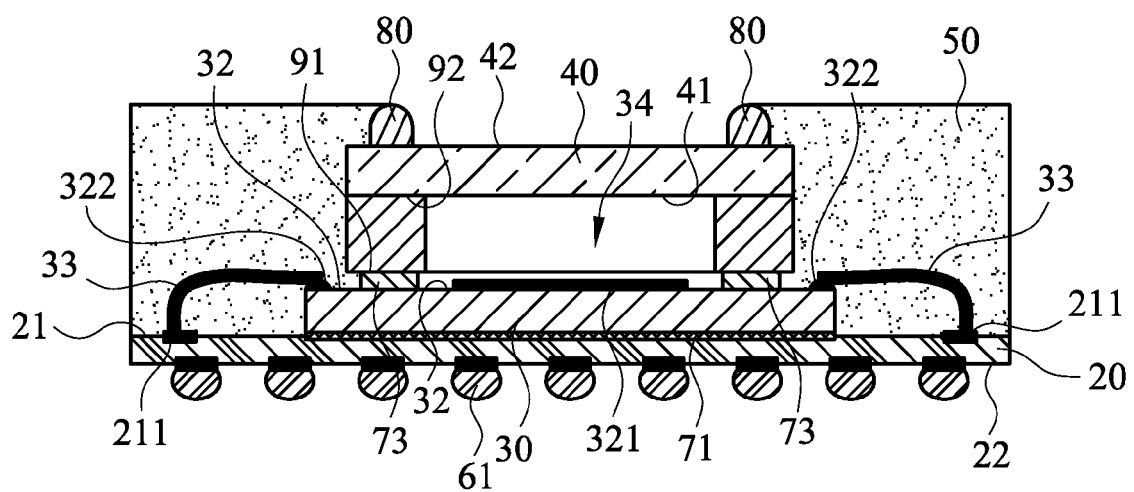
FIG. 3C is a cross-sectional view of the semi-finished image sensor packaging structure shown in FIG. 3B and provided with a low transmittance encapsulant by molding.

Referring to FIG. 3A through FIG. 3C, there are shown diagrams of another embodiment of the image sensor packaging structure. As shown in FIG. 3A through FIG. 3C, the image sensor packaging structure further comprises a support 90. The support 90 is a frame. The support 90 has a fifth surface 91, a sixth surface 92, and an opening 93. Referring to FIG. 3B and FIG. 3C, the fifth surface 91 of the support 90 is adhered to the second surface 32 of the chip 30 by a second adhesive layer 73. The second adhesive layer 73 is disposed between the sensitization area 321 of the chip 30 and the second conductive contacts 322.

Referring to FIG. 3A, the third surface 41 of the transparent lid 40 is coupled to the sixth surface 92 of the support 90 to thereby cover the opening 93 of the support 90. Since the opening 93 of the support 90 corresponds in position to the sensitization area 321 of the chip 30, the sensitization area 321 is exposed from the opening 93 of the support 90 and thereby remains uncovered.

Referring to FIG. 3B and FIG. 3C, the dam 80 is peripherally disposed at the periphery of the fourth surface 42 of the transparent lid 40, and the low transmittance encapsulant 50 is formed on the substrate 20 by molding to thereby encapsulate the metal wires 33, the chip 30, the transparent lid 40, and the support 90. The dam 80 blocks the low transmittance encapsulant 50 and stops the low transmittance encapsulant 50 from spilling onto the fourth surface 42 of the transparent lid 40.

Figure 4A:
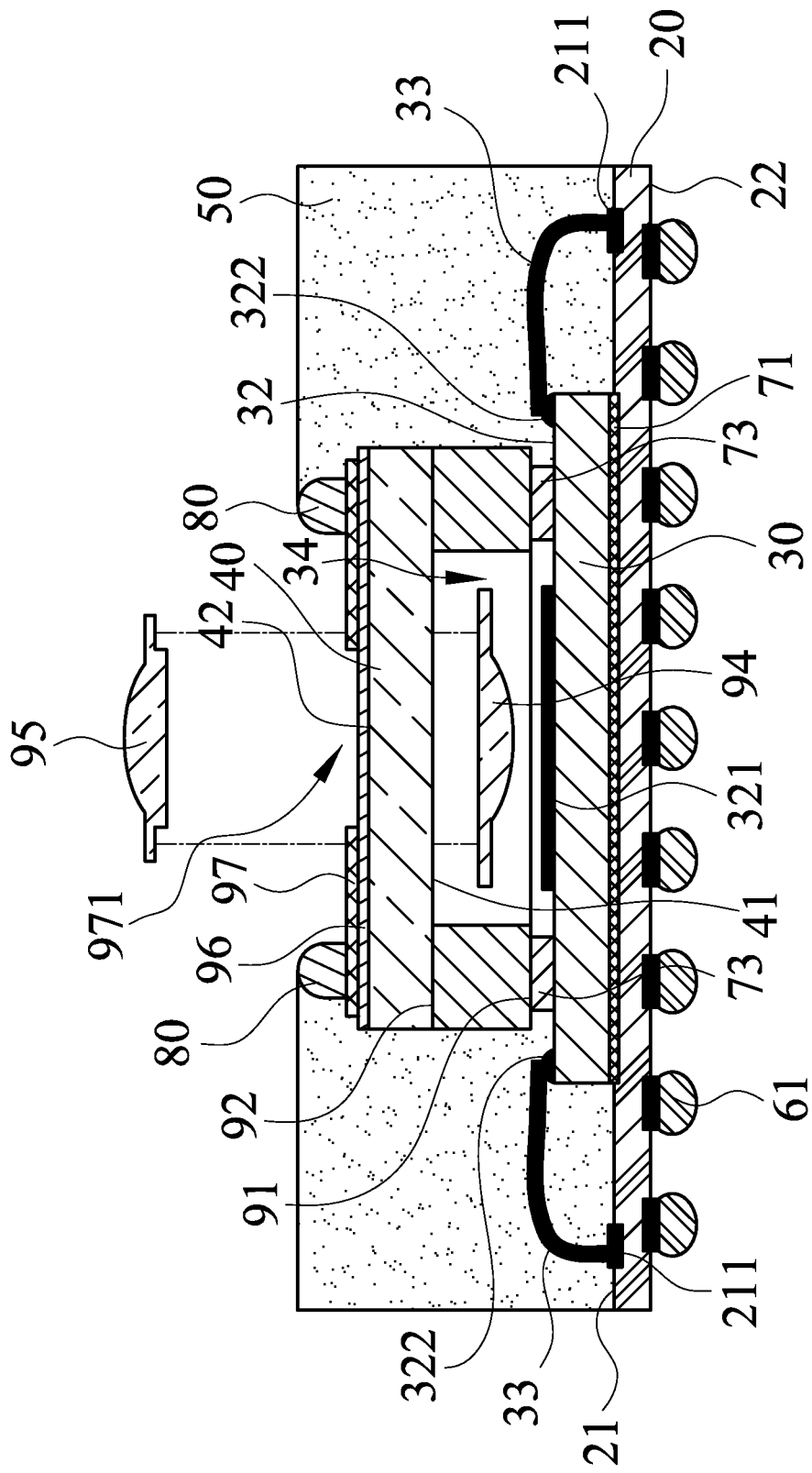
FIG. 4A is a partially disassembled cross-sectional view of another image sensor packaging structure with a low transmittance encapsulant according to the present invention.
Figure 4B:
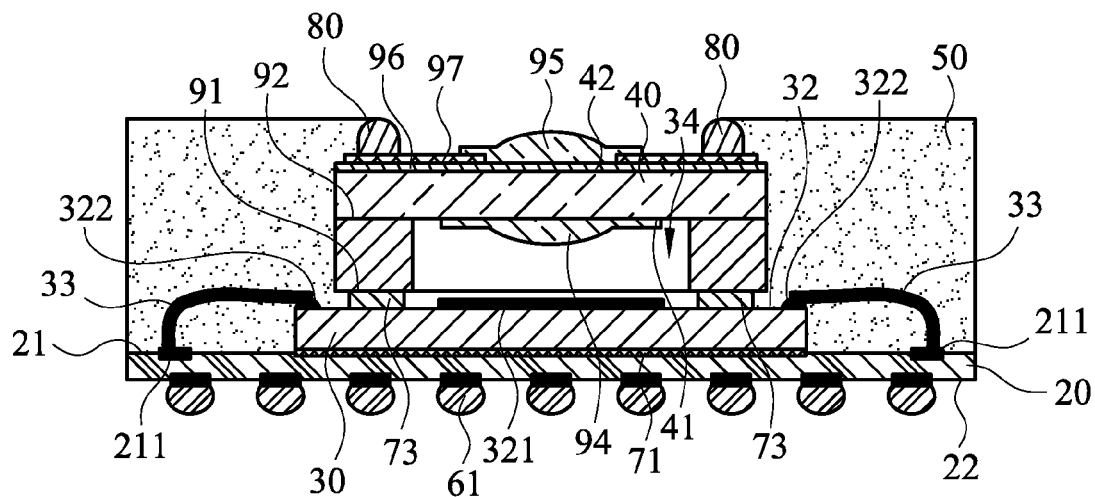
FIG. 4B is an assembled cross-sectional view of the image sensor packaging structure shown in FIG. 4A.

Referring to FIG. 4A and FIG. 4B, there are shown diagrams of yet another embodiment of the image sensor packaging structure, which is essentially the same as the embodiment shown in FIG. 3A through FIG. 3C, except that the third surface 41 and the fourth surface 42 of the transparent lid 40 are coupled to a first lens 94 and a second lens 95, respectively. The first lens 94 and the second lens 95 are spherical or non-spherical lenses. However, one of the first lens 94 and the second lens 95 must be a non-spherical lens, and the other one can be a spherical lens or a non-spherical lens.

Referring to FIG. 4A, an infrared filtering layer 96 for filtering out the infrared portion of visible light is disposed between the second lens 95 and the fourth surface 42 of the transparent lid 40. Preferably, a light-blocking layer 97 is disposed on the infrared filtering layer 96. A penetration window 971 corresponding in position to the second lens 95 is formed to penetrate the light-blocking layer 97, such that a light path can penetrate the light-blocking layer 97 by passing through the penetration window 971.

Figure 4C:
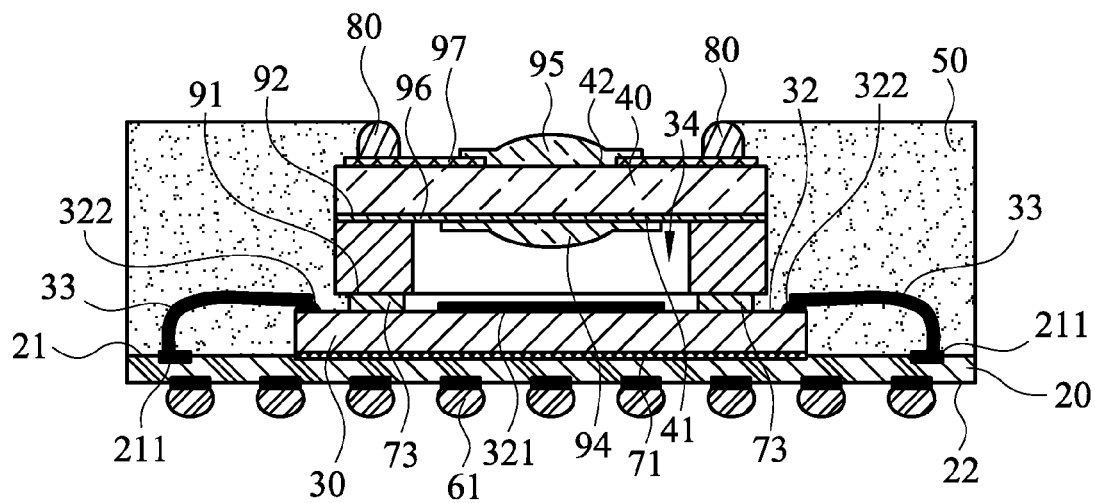
FIG. 4C is a cross-sectional view of another image sensor packaging structure with a low transmittance encapsulant according to the present invention.

Referring to FIG. 4C, alternatively, the infrared filtering layer 96 is disposed between the first lens 94 and the third surface 41 of the transparent lid 40, and the light-blocking layer 97 is disposed on the fourth surface 42 of the transparent lid 40. Still, the penetration window 971 (not shown) corresponding in position to the second lens 95 is formed to penetrate the light-blocking layer 97.

Where the image sensor packaging structure is not provided with the infrared filtering layer 96 and the light-blocking layer 97, the dam 80 is peripherally disposed at the periphery of the fourth surface 42 of the transparent lid 40 (not shown). Where the image sensor packaging structure is provided with the infrared filtering layer 96 and the light-blocking layer 97, the dam 80 is peripherally disposed at the periphery of the light-blocking layer 97, so as to block the low transmittance encapsulant 50 (as shown in FIG. 4 A through FIG. 4C).

Figure 5A:
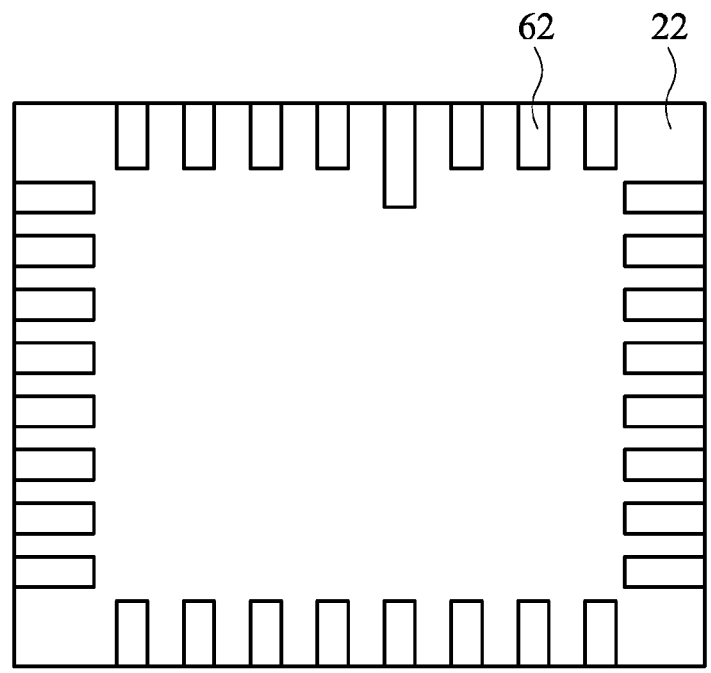
FIG. 5A is a schematic view of a first embodiment of solder pads disposed on a bottom surface of a substrate according to the present invention.
Figure 5B:
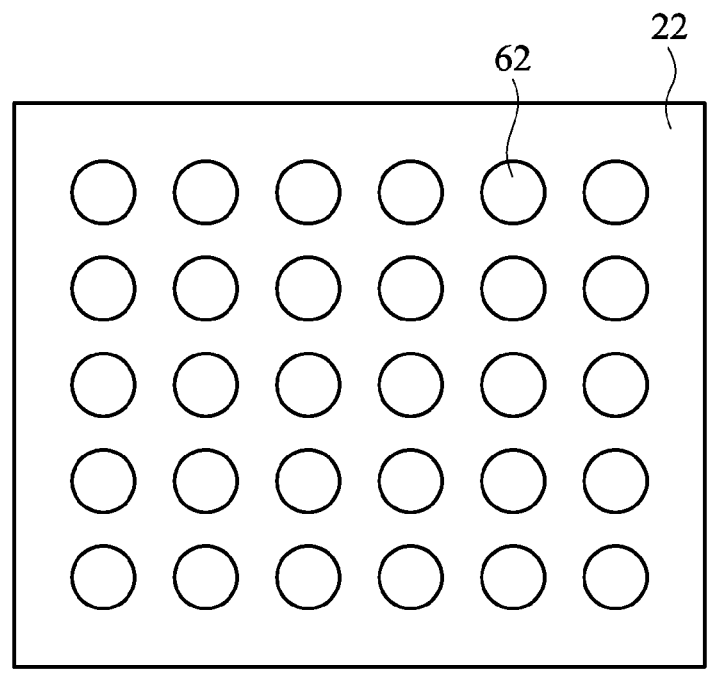
FIG. 5B is a schematic view of a second embodiment of the solder pads disposed on the bottom surface of the substrate according to the present invention.

Referring to FIG. 5A and FIG. 5B, not only are the solder balls 61 implanted on the bottom surface 22 of the substrate 20, but the bottom surface 22 of the substrate 20 is disposed thereon with a plurality of solder pads 62 signal-connected to the circuit structure of the substrate 20. The solder pads 62 are signal-connected to the first conductive contacts 211 on the substrate 20 (not shown). The image sensor packaging structure is signal-connected to another external device via the solder pads 62. Preferably, the solder pads 62 are peripherally disposed at the periphery of the bottom surface 22 of the substrate 20 (as shown in FIG. 5A) or disposed in array on the bottom surface 22 of the substrate 20 (as shown in FIG. 5B).

Figure 6A:
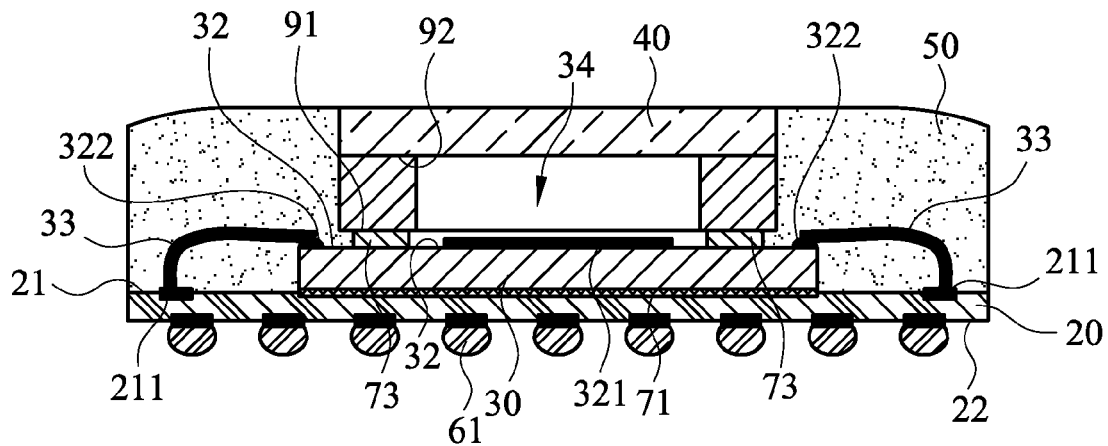
FIG. 6A through FIG. 6C are cross-sectional views of an image sensor packaging structure provided with a low transmittance encapsulant formed by dispensing according to the present invention.
Figure 6B:
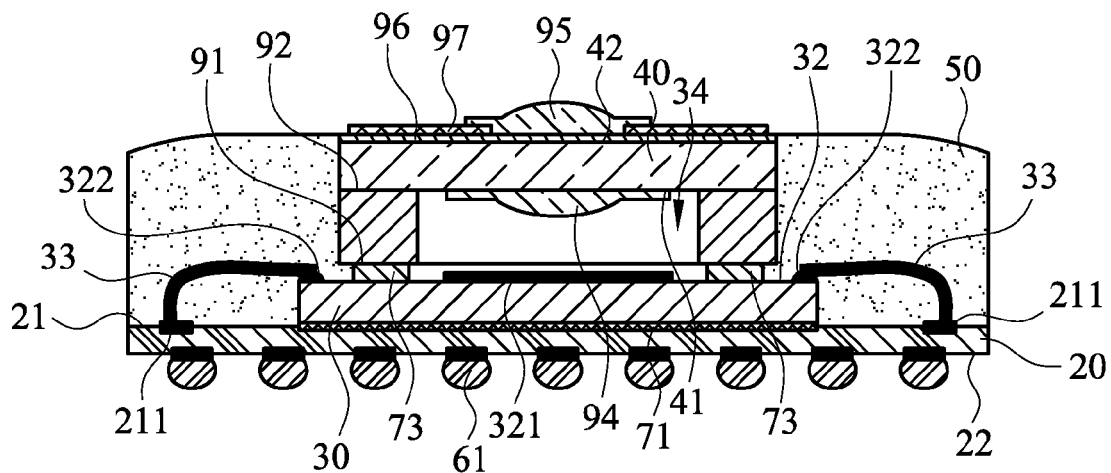
Figure 6C:
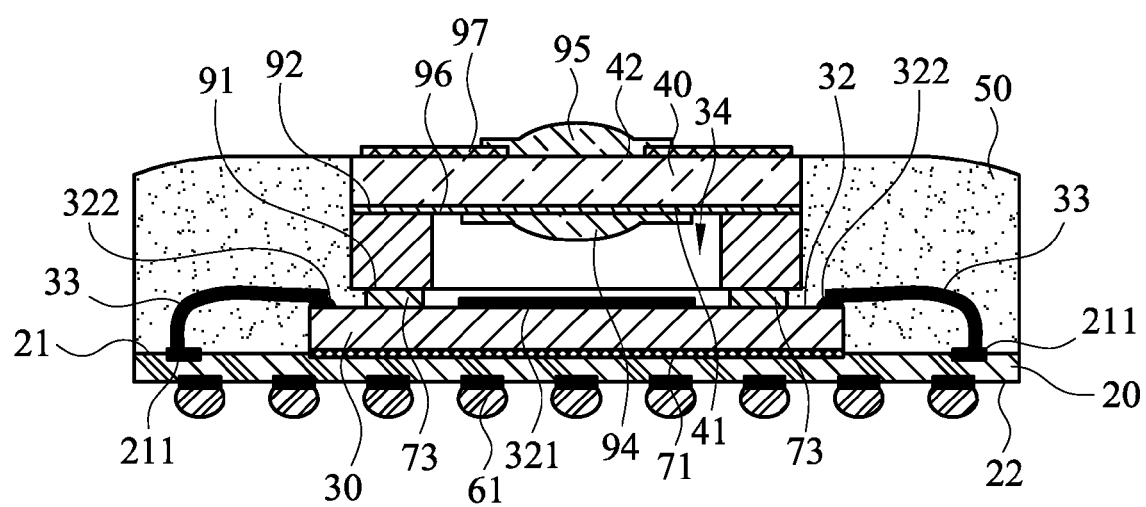

Referring to FIG. 6A through FIG. 6C, the low transmittance encapsulant 50 also can be formed on the substrate 20 by dispensing. Forming the low transmittance encapsulant 50 by dispensing removes the necessity of disposing the dam 80 on the image sensor packaging structure, and in consequence, the height and the volume of the finished image sensor packaging structure can be reduced.

As disclosed in the above embodiments, the finalized image sensor packaging structure results in low transmittance, which enables the low transmittance encapsulant 50 to function as an encapsulant. The structure is also configured to prevent ambient light rays from entering the image sensor packaging structure sideways as well as preclude multipath refraction, multipath reflection, and multipath scattering of the light rays inside the image sensor packaging structure. These added advantages ultimately prevent the image sensing and imaging performance of the image sensor packaging structure from being affected by the ambient light rays.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit and principles in the disclosure of the present invention should fall within the scope of the invention as set forth in the appended claims.

What is claimed is:

1. An image sensor packaging structure with a black encapsulant, the image sensor packaging structure comprising:
   a substrate having a carrying surface and a bottom surface, the carrying surface having formed thereon a plurality of first conductive contacts;
   a chip fixedly positioned on the substrate and having a first surface, a second surface and a plurality of second conductive contacts, the first surface being coupled to the carrying surface of the substrate, the second surface being defined with a sensitization area, and the second conductive contacts being signal-connected to the first conductive contacts;
   a support having an upper surface and a lower surface with an opening defined through the support, the support being fixedly positioned on the second surface of the chip with the opening positioned with and surrounding the sensitization area of the chip, wherein the lower surface of the support is adhered to the second surface of the chip with an adhesive layer between the sensitization area and the second conductive contacts:
   a transparent lid having an upper surface and a lower surface fixedly positioned on the upper surface of the support above the sensitization area foaming an air cavity;
   a dam formed on the upper surface of the transparent lid along an outer periphery thereof to surround an inner portion of the upper surface of the transparent lid; and
   a black encapsulant formed on the substrate to encapsulate the carrying surface of the substrate, the first and second conductive contacts, and outer peripheral surfaces of the chip, the support and the transparent lid, wherein the black encapsulant is formed to surround and directly contact with an outer periphery of the transparent lid and an outer periphery of the dam, the upper surface of the black encapsulant is formed higher than the upper surface of the transparent lid and coplanar with a topmost surface of the dam and the dam is positioned to directly contact with the black encapsulant away from the inner portion of the upper surface of the transparent lid surrounded by the dam.

2. The image sensor packaging structure of claim 1, wherein the chip is a complementary metal oxide semiconductor (CMOS) image sensing chip or a charge-coupled device (CCD).

3. The image sensor packaging structure of claim 1, wherein the sensitization area comprises a plurality of photosensitive elements.

4. The image sensor packaging structure of claim 1, wherein the second conductive contacts are positioned outside an outer periphery of the support.

5. An image sensor packaging structure with a black encapsulant, the image sensor packaging structure comprising:
   a substrate having a carrying surface and a bottom surface, the carrying surface having formed thereon a plurality of first conductive contacts;
   a chip fixedly positioned on the substrate and having a first surface, a second surface and a plurality of second conductive contacts, the first surface being coupled to the carrying surface of the substrate, the second surface being defined with a sensitization area, and the second conductive contacts being signal-connected to the first conductive contacts;
   a support having an upper surface and a lower surface with an opening defined through the support, the support being fixedly positioned on the second surface of the chip with the opening positioned with and surrounding the sensitization area of the chip, wherein the lower surface of the support is adhered to the second surface of the chip with an adhesive layer between the sensitization area and the second conductive contacts:
   a transparent lid having an upper surface and a lower surface fixedly positioned on the upper surface of the support above the sensitization area forming an air cavity;
   a dam formed on the upper surface of the transparent lid along an outer periphery thereof;
   a first lens directly attached to the lower surface of the transparent lid and inside the air cavity;
   a second lens directly attached to the upper surface of the transparent lid, the dam surrounding the second lens; and
   a black encapsulant formed on the substrate to encapsulate the carrying surface of the substrate, the first and second conductive contacts, and outer peripheral surfaces of the chip, the support and the transparent lid, wherein the black encapsulant is formed to surround and directly contact with an outer periphery of the transparent lid and an outer periphery of the dam, the upper surface of the black encapsulant is formed higher than the upper surface of the transparent lid and coplanar with a topmost surface of the dam and the dam is positioned to directly contact with the black encapsulant away from the second lens and the upper surface of the transparent lid surrounded by the dam.

6. The image sensor packaging structure of claim 5, wherein at least one of the first lens and the second lens is a non-spherical lens.

7. The image sensor packaging structure of claim 5, wherein the first lens is a spherical lens or a non-spherical lens.

8. The image sensor packaging structure of claim 5, wherein the second lens is a spherical lens or a non-spherical lens.

9. The image sensor packaging structure of claim 5, wherein an infrared filtering layer is disposed between the second lens and the upper surface of the transparent lid.

10. The image sensor packaging structure of claim 9, further comprising a light-blocking layer disposed on the infrared filtering layer and formed therein with a penetration window corresponding in position to the second lens.

11. The image sensor packaging structure of claim 5, wherein an infrared filtering layer is disposed between the first lens and the lower surface of the transparent lid.

12. The image sensor packaging structure of claim 11, further comprising a light-blocking layer disposed on the upper surface of the transparent lid and formed therein with a penetration window corresponding in position to the second lens.

* * * * *